DIFFERENTIAL DIRECT-CURRENT AMPLIFIER
Original Filed Feb. 2, 1959
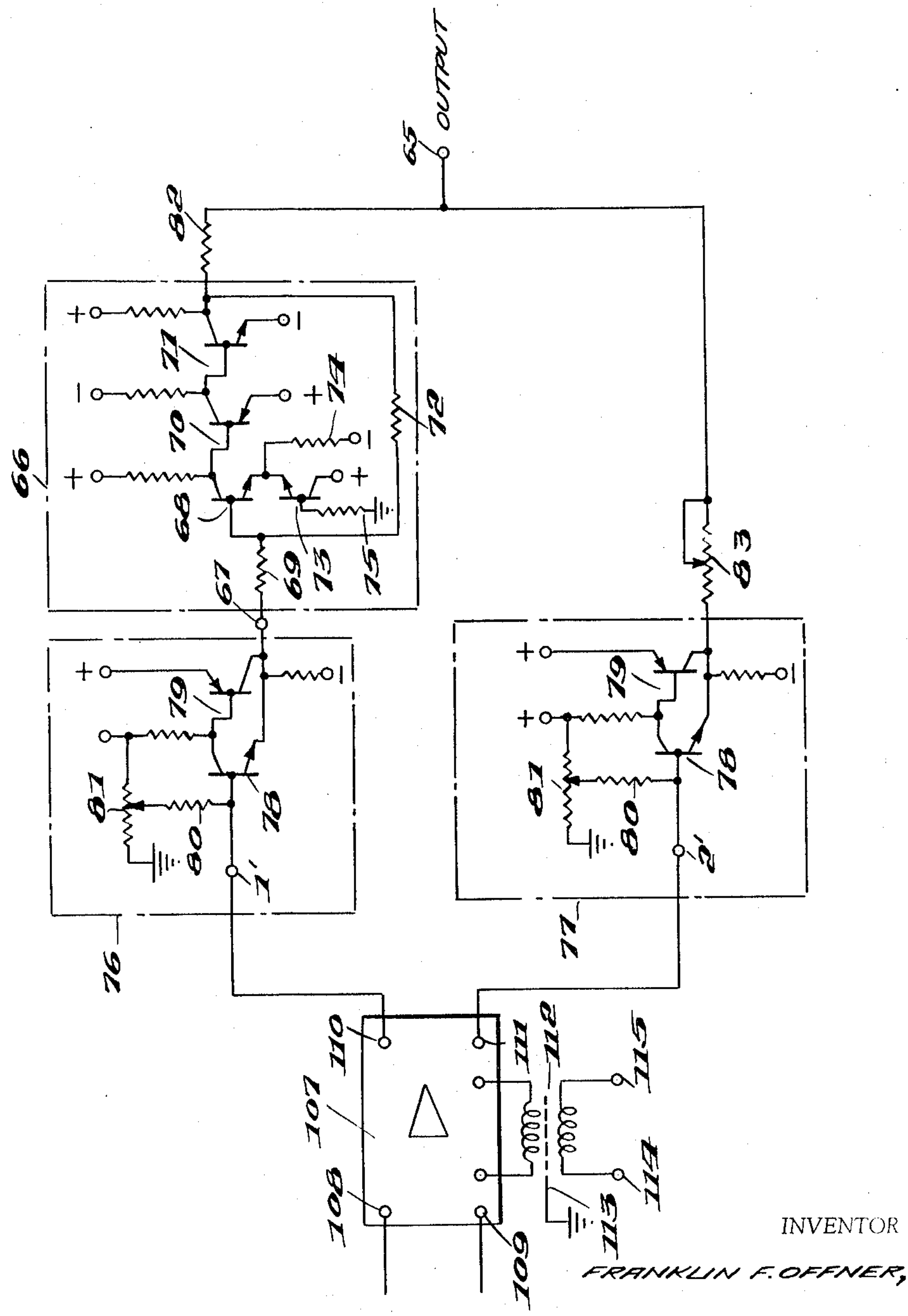
INVENTOR
FRANKLIN F. OFFNER,
BY Pierce, Scheffler & Parker
ATTORNEYS United States Patent Office 3,304,513

Patented Feb. 14, 1967

3,304,513

DIFFERENTIAL DIRECT-CURRENT AMPLIFIER

Franklin F. Offner, 1890 Telegraph Road, Deerfield, Ill. 60015

Original application Feb. 2, 1959, Ser. No. 790,498. Divided and this application May 28, 1964, Ser. No. 370,882

3 Claims. (Cl. 330—69)

This invention relates to electrical amplifiers of the differential, direct current type, and this particular application is a division of my co-pending application Serial No. 790,498 filed February 2, 1959, now abandoned.

Differential amplifiers of various types have already been developed and typical of these are the arrangements disclosed in my previously granted United States Patents Nos. 2,931,985; 2,954,529; 3,018,444, and 3,079,565.

An object of the present invention is to provide a further improved amplifier of the differential type. In particular, one limitation of the prior developed differential amplifiers has been that, if of the chopper type to insure a high degree of stability, they have been limited in frequency response—while if of the direct-coupled type, they have inferior stability. The present invention offers a unique solution to this problem and one embodiment thereof will now be described and is illustrated in the accompanying drawing, the single view of which is an electrical schematic.

With reference to the drawing, an input amplifier, which may be of the chopper-stabilized type, as well known in the art, is designated by numeral 107 and is shown only in block form since its construction is well known and hence per se forms no part of the present invention. The input terminals to this amplifier are indicated at 108, 109 and the output terminals are indicated at 110 and 111. These output terminals are connected respectively to terminals 1′ and 2′ of a differential amplifier which comprises an amplifier section 76 correlated to input terminal 1′ followed by a phase inverter section 66 and an amplifier section 77 correlated to input terminal 2′.

The differential action is obtained by adding the input signal applied between terminal 1′ and ground of amplifier 76, in reverse phase to the input signal applied between terminal 2′ and ground of amplifier 77. The signal appearing at terminal 65 is equal to one-half the sum of these two signals. The reversal of phase of the signal applied at terminal 1′ is accomplished through phase reversing amplifier 66. The input signal to this amplifier, as developed in point 67, is applied to the input base of transistor 68 through resistor 69. There are a total of three transistor stages 68, 70 and 71, directly coupled, of alternate PNP and NPN type in amplifier 66. Since each stage reverses the phase, after three stages the phase is reversed at the output from the input. Resistor 72 feeds back the output signal to the input base of transistor 68. The gain of this amplifier is sufficiently high so that the feedback signal to the input is sufficient to maintain the input base at a substantially constant potential, as the signal is varied at point 67. That is, if resistors 69 and 72 are of equal value, the output signals at the collector of transistor 71 will be practically identical in amplitude, but opposite in phase, to the signal applied at point 67. It will be seen that under these conditions, the sum of the two signals is equal to zero at the input to transistor 68. This circuit thus acts to reverse the phase of the signal at point 67.

The function of transistor 73 is to prevent changes in ambient temperature from causing a shift in the output of amplifier 66. Temperature has been found to have two effects upon the functioning of a transistor. One such effect is to increase the leakage current from base to collector. This current will double approximately every 10° C. The second effect is to change the base-to-emitter voltage required for a given collector circuit. This voltage changes approximately five millivolts for every degree centigrade. Both of these effects may be substantially cancelled by the use of an auxiliary balancing transistor 73. The latter should be similar to transistor 68, and particularly, it should have closely the same value of leakage current. Resistor 74 is connected at one end thereof to the common emitter point of transistors 68 and 73 and at the other end to a source of negative potential. Resistor 74 is made relatively large, and if the negative potential applied is sufficient to maintain the common emitter point at the desired potential, then its emitter will take on a potential negative with respect to ground, as required, to maintain the proper current through resistor 74. If the ambient temperature changes, the emitter-to-base potential of transistor 73 will corresponding change the required amount to maintain this current substantially constant. This then changes the potential at which the emitter of transistor 68 is maintained, changing it by the amount required to maintain the current through its emitter circuit, also constant. Resistor 75 is added in the base circuit of transistor 73, to provide compensation for the changes in leakage current. If the leakage currents of transistors 73 and 68 are equal, then if resistors 69 and 75 are also equal, the change in base voltage of transistor 68 is matched by that of transistor 73. However, an increase in the base voltage of transistor 73 must be matched by an equal change in the emitter voltage, to maintain the emitter-base potential at a constant value. This also causes a simultaneous change in the emitter voltage of transistor 68, which thus cancels out the change which occurred in the base voltage of transistor 68, as a result of the leakage current change through resistor 69. Thus, both effects of temperature on transistor 68 are effectively cancelled by transistor 73.

Amplifiers 76 and 77 are similar to one another. Their function is to isolate the two input terminals effectively from their outputs, and to provide a high input impedance for the amplifier 66. Each of the amplifier sections 76 and 77 is a two-stage amplifier with unity negative feedback. Each amplifier section has an NPN input transistor 78, directly coupled to PNP output transistor 79. The emitter of transistor 78 is connected to the collector of transistor 79, giving the desired unity feedback. The result is substantially unity voltage gain, but with a current gain equal to the product of the current gain of the two transistors. This may be approximately 5000. As a result, the input impedance, looking into the base of transistor 78 will be approximately 5000 times the load in the collector circuit of transistor 79.

To obtain the proper collector operating current in transistor 78, a base current equal approximately to the collector current divided by the current gain of the transistor, must be employed. To provide this current, high value resistor 80 is connected from the base of transistor 78 to an adjustable source of positive potential, provided by variable potentiometer resistor 81. This latter resistor is so adjusted that the voltage at input terminal 1′ is substantially zero, when the output at point 67 is zero. A similar circuit is employed in the amplifier section 77 with regard to input terminal 2′.

The output of amplifier 66 and the output of amplifier 77 are added through adding resistors 82 and 83 which are of substantially equal value. However, one of them, for example, resistor 83, may be made variable to ensure that the voltage at point 65, resulting from the application of a signal of a given magnitude at input terminal 1′, is exactly equal and opposite to that resulting from the application of an equal signal at input terminal 2′.

Amplifier 107 need not be of the differential type, but may have single-ended input, as is common in chopper-stabilized amplifiers. In order to obtain differential operation, this amplifier is operated isolated from ground. To obtain this, it may be operated from batteries, or it may be operated from an alternating current power supply, being electrically isolated from ground by the use of an isolating power transformer. This is shown in the drawing as transformer 112 and includes an electrostatic, grounded shield 113 between its primary and secondary windings. Alternating current from the power line is connected to the terminals 114, 115 on the primary side.

Since amplifier 107 is of the direct-connected type, it may have a frequency response extending far beyond the frequency of the chopper, which is employed only for stabilizing the amplifier in accordance with well known principles of the chopper-stabilized amplifier. The effect of the addition of this amplifier to the differential action of the complete amplifier circuit will now be considered. Consider that the differential amplifier of which 1', 2' are the input terminals, is so balanced that only one-thousandth as much of a signal applied in common to input terminals 1' and 2' appears at the output terminal 65, as for a differential signal applied between terminals 1' and 2'. That is, consider that the "rejection ratio" of this amplifier is one thousand. Now consider that amplifier 107 has a gain of one hundred. Then the signal applied between its input terminals will be amplified one hundred times before being applied to terminals 1' and 2'. However, any signal applied in common between terminals 108 and 109, and ground, will not be amplified or diminished, but will be transmited unchanged in effect to the output terminals. Then the desired, differential action is thus amplified one hundred times, while the undesired, common signal is transmitted at its original amplitude. The result is that the rejection ratio of the complete amplifier is one hundred times one thousand or one hundred thousand. It is thus seen that a very substantial improvement in the rejection ratio is thus obtained, while maintaining the frequency response possible with a chopper-stabilized amplifier.

At the same time, any drift which may be inherent in the succeeding differential amplifier, following terminals 1', 2', is reduced in effect by the amplification of input amplifier, and may thus be made negligible.

In conclusion, it will be apparent that this invention may employ a wide variety of amplifier types at 107, as well as for the following differential amplifiers, the essential nature of the invention being unchanged thereby.

I claim:

1. A differential amplifier including a first amplifier section isolated from ground, said first amplifier section being of the single-ended type and producing an output signal which is substantially an amplified facsimile of the input signal applied thereto and including two output terminals, and a second amplifier section of the differential type connected to the two output terminals of said first amplifier section.

2. Amplification means including, a first signal input terminal, a second signal input terminal, a first reference terminal, an input amplifier having two input terminals connected respectively to said first and said second input terminals, said input amplifier being electrically isolated from said reference terminal, said amplifier being characterized by having its output signal substantially an amplified facsimile of the input signal applied thereto, first and second output terminals connected to the output of said input amplifier, a differential amplifier having a third input terminal, a fourth input terminal, a second reference terminal, and two output terminals, said differential amplifier being characterized by having its output signal between said output terminals substantially proportional to the difference in the signals applied between said third input terminal and said second reference terminal, and the signal applied between said fourth input terminal and said second reference terminal, circuit connections between said first output terminal and said third input terminal, and circuit connections between said second output terminal and said fourth input terminal.

3. Amplification means as defined in claim 2, wherein said first and second reference terminals are electrically connected.

References Cited by the Examiner

UNITED STATES PATENTS

| | | | |
|---|---|---|---|
| 2,796,468 | 6/1957 | McDonald | 330—119 X |
| 3,050,692 | 8/1962 | Willard. | |
| 3,088,076 | 4/1963 | Burwen | 330—9 |
| 3,092,783 | 6/1963 | Krohn | 330—69 X |
| 3,101,451 | 8/1963 | Burgarella et al. | 330—9 X |

ROY LAKE, *Primary Examiner.*

N. KAUFMAN, *Assistant Examiner.*